United States Patent [19]
Dworsky et al.

[11] 4,454,639
[45] Jun. 19, 1984

[54] METHOD FOR TUNING PIEZOELECTRIC RESONATORS

[75] Inventors: Lawrence N. Dworsky, Northbrook, Ill.; Douglas H. Weisman, North Lauderdale; Loi Q. Ninh, Lauderhill, both of Fla.

[73] Assignee: Motorola, Inc., Schaumburg, Ill.

[21] Appl. No.: 384,827

[22] Filed: Jun. 3, 1982

[51] Int. Cl.³ .......................................... H01L 41/22
[52] U.S. Cl. ................................. 29/25.35; 310/312; 427/39; 427/100
[58] Field of Search ............... 29/25.35, 593; 310/312; 427/100, 39

[56] References Cited

U.S. PATENT DOCUMENTS

| | | | |
|---|---|---|---|
| 2,505,370 | 4/1950 | Sykes | 29/25.35 X |
| 2,765,765 | 10/1956 | Bigler et al. | 29/25.35 X |
| 2,808,523 | 10/1957 | Holmbeck | 29/25.35 X |
| 3,006,711 | 10/1961 | Silver | 29/25.35 X |
| 3,028,262 | 4/1962 | Klingsporn | 29/25.35 X |
| 3,585,418 | 6/1971 | Koneval | |
| 3,832,761 | 9/1974 | Sheanhan et al. | |
| 3,916,351 | 10/1975 | Jacobs et al. | |
| 4,107,349 | 8/1978 | Vig | |
| 4,142,164 | 2/1979 | Nishikawa et al. | |
| 4,213,104 | 9/1978 | Cullen et al. | |
| 4,232,239 | 11/1980 | Dworsky et al. | |

OTHER PUBLICATIONS

"Direct Plating to Frequency-A Powerful Fabrication Method for Crystals with Closely Controlled Parameters," Proceedings of the 30th Annual Symposium on Frequency Control, Germany, pp. 209-213, (1976), R. Fisher, L. Schulzke.

"A Novel Method of Adjusting the Frequency of Aluminum Plated Quartz Crystal Resonators" Virgil E. Bottom, Tyco Crystal Products, Inc., Proceedings of the 30th Annual Symposium on Frequency Control, Germany, pp. 249-253, (1976).

*Primary Examiner*—Carl E. Hall
*Attorney, Agent, or Firm*—Jerry A. Miller; Edward M. Roney; James W. Gillman

[57] ABSTRACT

A method for adjusting the frequency of a piezoelectric resonator such as a quartz crystal is disclosed. The resonator is placed within its enclosure facing a metallic surface. The atmosphere within the enclosure is made suitable for supporting a glow discharge. An electrical potential is then established between the resonator electrode and the metallic surface causing mass to sputter between the electrode and to the metallic surface to vary the characteristics of the resonator.

8 Claims, 3 Drawing Figures

METHOD FOR TUNING PIEZOELECTRIC RESONATORS

BACKGROUND OF THE INVENTION

1. Field of the Invention

This invention relates to the field of adjusting the resonant frequency of piezoelectric resonators and more particularly to procedures for tuning piezoelectric resonators after the resonator has been packaged in a hermetically sealed enclosure.

2. Description of the Prior Art

Many methods of tuning piezoelectric resonators prior to packaging in a sealed enclosure are well known in the art. Such methods include mass loading by sputtering, mass removal by etching, spot plating by metal deposition, dielectric mass loading, mass removal by laser trimming, chemical reaction from gas atmosphere, direct plating to frequency, and mass loading by electroplating are well known and frequently used. Of these methods only one, dielectric mass loading, has been shown to be adaptable to tuning resonators after packaging. This is especially true if the packaging enclosure is hermetically sealed. It is frequently necessary to tune after packaging to avoid disturbing the resonator frequency during the sealing process and to adjust resonators in the field to counteract aging effects.

In the prior art in-can tuning method of dielectric mass loading, the resonator is placed within a specialized can which has been back-filled with a polymerizable gas such as tetrafluoroethylene. The gas is polymerized by radiation and the resulting polymer deposits on the resonator increasing its mass and lowering its resonant frequency. Once the polymerizable gas has been used up no further adjustment is possible. Therefore, it is evident this method cannot be used more than once for any given device and the process is not reversible to correct overadjustment.

A major disadvantage of this prior art process is that a specialized enclosure must be used resulting in greater expense. Preferably, the enclosure must be made of a material which is transparent to the radiation being used for the polymerization. The preferred enclosure material is fused quartz or sapphire since these materials allow some of the less dangerous forms of radiation to be used to polymerize the gas within the enclosure. Alternatively, the housing may contain a source of radiation itself such as a glow discharge source but this also increases the cost of the enclosure.

The recommended enclosure for this prior art process also includes a separate compartment shielded from the main portion of the enclosure. Any remaining unpolymerized gas is polymerized in this compartment after the trimming or adjustment is complete. The unpolymerized gas must be eliminated after the trim in order to avoid excessive aging and thermal hysteresis problems. This process is, therefore, costly, difficult to implement and non-reversible.

A further disadvantage of this prior art method is that mass loading of resonators with dielectric material can reduce the Q and raise the series resistance of the resonator. This is especially critical in higher frequency resonators, and severely limits the electrical performance of VHF crystals so processed. There is also some concern for the long term stability of crystals which are trimmed according to this process.

SUMMARY OF THE INVENTION

It is an object of the present invention to provide an improved method of tuning piezoelectric resonators.

It is another object of the present invention to provide an improved method of tuning piezoelectric resonators after packaging in sealed enclosures.

It is a further object of the present invention to provide a reversible method for tuning piezoelectric resonators.

These and other objects of the invention will become apparent to those skilled in the art upon consideration of the following description of the invention.

The present invention is directed to adjusting the frequency of a piezoelectric resonator device which has a metallic electrode. The resonator device to be tuned is placed inside an enclosure which has an internal metallic surface. This internal metallic surface should be electrically accessible from the outside of the enclosure. An atmospheric environment suitable for supporting an electrical glow discharge is provided within the enclosure and the enclosure is permanently sealed. An electrical potential appropriate for establishing an electrical glow discharge between the metallic electrode and the internal metallic surface is then applied. This glow discharge causes metallic particles to sputter altering the mass loading of the resonator while sealed in the enclosure. If the resonator frequency is overadjusted an electrical potential of opposite polarity can be established to cause metal to sputter in the opposite direction. Preferably, the metallic surface is an inner surface of a substantially all metal enclosure.

The features of the invention believed to be novel are set forth with particularity in the appended claims. The invention itself, however, both as to organization and method of operation, together with further objects and advantages thereof, may be best understood by reference to the following description taken in conjunction with the accompanying drawings.

DESCRIPTION OF THE PREFERRED EMBODIMENT

Figure 1:
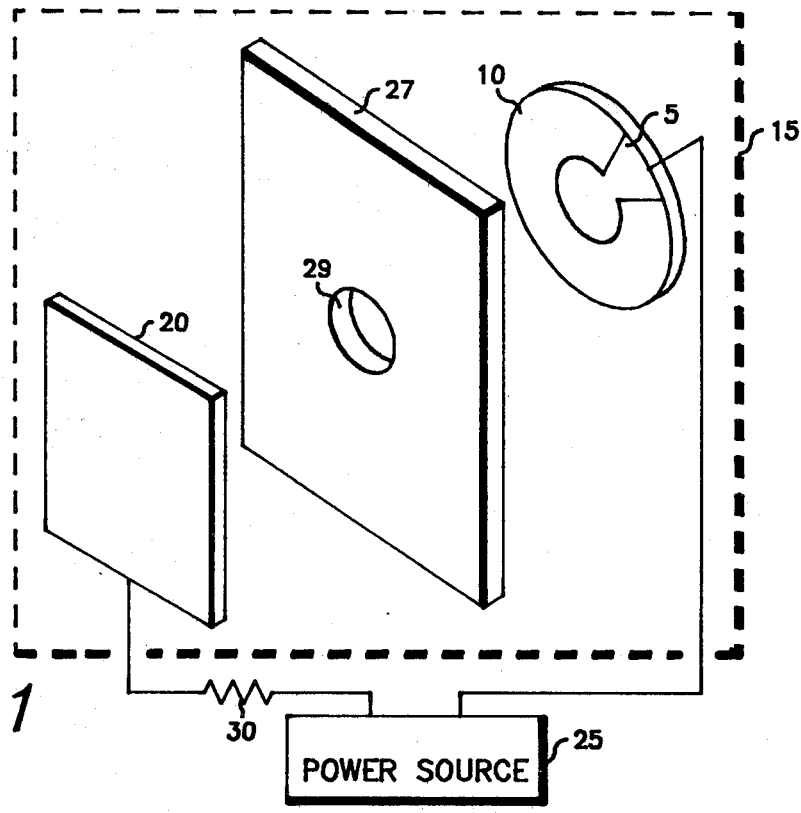
FIG. 1 illustrates the tuning methods of the present invention.

The present invention utilizes a glow discharge metal sputtering technique to adjust the resonant frequency of piezoelectric resonators after packaging in an enclosure which may be hermetically sealed. In FIG. 1 the resonator to be tuned is shown as a metallic electrode 5 deposited on a major surface of a substrate 10. The substrate 10 is normally composed of a crystaline or ceramic dielectric material. In the preferred embodiment, the substrate is substantially planar, the dielectric material is quartz and the resonator assembly is known as a quartz crystal. This resonator is normally mounted by spring clips or the like to a base structure (not shown) both for support and to facilitate electrical interconnection to the resonator's metallic electrodes. The resonator may be fabricated using any known resonator fabrication technology. The resonant frequency of the resonator is preferably established at a value lower than that value which is actually desired.

The device is packaged within an enclosure 15 which is preferrably hermetically sealed. Normally the electrodes will be electrically accessible from outside the enclosure. The enclosure may be a predominantly metal enclosure such as the crystal resonator industry standard HC-18 can without modifications. Alternatively, other types of packaging may be used so long as a metallic surface 20 is provided in an orientation substantially facing the resonator. Metallic surface 20 should be electrically accessible from the exterior of the hermetically sealed enclosure. In the preferred embodiment, metallic surface 20, is the inner surface of a metal enclosure 15. Although metallic surface 20 is shown in FIG. 1 as a planar rectangular shape, this is not to be limiting as almost any shape is acceptable.

The atmospheric environment inside the enclosure 15 is first evacuated to remove oxygen and other undesired gasses and then backfilled with an inert gas such as Argon to a pressure of approximately 0.70 to 0.85 torr (760 torr=1 ATM) prior to sealing. The use of Argon at this pressure is not to be limiting as any atmospheric environment appropriate for supporting a glow discharge would be satisfactory.

After measuring the initial frequency of the resonator, a DC power source 25 is connected between the metallic electrode 5 and the metallic surface 20. This power source should be capable of supplying a polarized voltage on the order of approximately 300 to 600 volts between the interior metallic surface of the sealed enclosure and the resonator's metallic electrode 5. In the preferred embodiment, the metallic electrode 5 is initially electrically biased negatively with respect to metallic surface 20. Due to the electric field in the enclosure, a glow discharge is established in the low pressure Argon. The positive ions are attracted to the resonator electrode surface causing a transfer of metallic particles by sputtering of resonator electrode material from electrode 5 to metallic surface 20. The metallic surface 20 and the electrode 5 should of course be clean and free of contaminants enough to assure good adhesion of the sputtered material. Since the resonator electrode 5 is losing mass to the metallic surface 20, the resonant frequency of the resonator will increase.

Although a DC power source 25 at 300 to 600V is used for the preferred embodiment, it will be evident to those skilled in the art that an R.F. source or any suitable source for obtaining a glow discharge may be used with equivalent success.

Periodic or continuous measurement of the resonant frequency may be necessary to determine when the resonator has been adjusted to the proper frequency. When that frequency is reached, the potential may be removed to prevent any further frequency adjustment. If by chance the resonator is overtrimmed, that is too much mass is removed from the metallic electrode 5, it is only necessary to reverse polarity of the power source 25 and, thus, deposit metallic particles from the metallic surface 20 to the metallic electrode 5. This reverse process increases the mass of the resonator and, thereby, lowers the resonator frequency. This reverse process is more readily accomplished if metallic surface 20 is plated with or composed of a readily sputterable material, but this is not absolutely necessary. Since no material actually leaves the enclosure during the process of removing metal from electrode 5, that removed metal is available to be redeposited on electrode 5.

It should be noted that in the preferred embodiment, the aforementioned reverse process is used only as a correction for overtrims. This is not to be limiting, however, since this reverse process can be used as an adjustment technique by itself for resonators which are fabricated with an initial resonant frequency higher than that which is finally desired.

Preferably, this tuning process should only be utilized for relatively small frequency corrections since the sputtering source will tend to act like an isotropic radiating surface releasing metallic particles in all directions. While this is of no consequence when removing electrode metalization, electrode pattern definition will be decreased when depositing electrode material back out to the resonator by this method, since metal will be deposited statistically over the entire surface of the substrate. If the resonator is part of a monolithic filter for other multi-resonator device it may be possible to electrically short resonators together if too much material is sputtered back onto the substrate 10 in a specific area.

The problem of redeposition may be alleviated somewhat by placing a shadow mask 27 between the metallic surface 20 and the resonator electrode. This masking device would direct sputtered metal through aperture 29 only to desired areas of the substrate and thereby avoid shorting resonators of multi-resonator designs. Mask 27 is preferably composed of graphite, ceramic, titanium or other material which has a very slow sputtering rate compared to that of the resonator electrode. Use of mask 27 would allow the trim and reversal procedures to be repeated many times without affecting the device integrity. Other devices for directing the sputtered metal to desired areas and away from undesired areas will occur to those skilled in the art.

It should be noted that this tuning process could be repeated a number of times. This could be highly advantageous for making small periodic resonator trims to correct for aging. Also, it could lend itself to direct tuning of fixed oscillators to eliminate variable coils and capacitors.

The preferred electrode materials for this process are gold and silver primarily due to their high sputtering rates and long term stability but other metals which are not highly chemically reactive with oxygen may also be used. However, certain VHF quartz devices can only be practically realized utilizing aluminum for the electrode material. Aluminum electrodes are not ideally suited to the above-described process since aluminum is highly chemically reactive with oxygen and very rapidly forms an oxide layer approximately 50 angstroms thick on its surface after manufacture. This oxide layer sputters very slowly. However, once the layer has been penetrated, the aluminum metal itself sputters very rapidly. This change in sputtering rates makes the process difficult to control. The aluminum electrode will also reoxidize shortly after the sputtering has been discontinued causing the resonator to change frequency significantly if the enclosure has not been completely purged of oxygen. For example, in a 150 MHz resonator, a one angstrom thick layer of aluminum oxide has been found to change the resonator frequency by approximately 250 Hz.

If aluminum is to be used for the electrode material it should be deposited in a slightly thinner layer than would normally be required. The oxidized electrode should then be overcoated with a thin, approximately 25 angstroms, layer of gold or other metal which is less chemically active and sputters rapidly. This layer should be thick enough to increase the resonator's mass sufficiently to cause the resonator frequency to be lower than finally required.

A simple way to accomplish this is to deposit the gold over the entire substrate. Even for a polished quartz substrate, the surface is rough enough so that a 25 angstroms layer is not electrically continuous so there is no danger of shorting electrodes for multi resonator devices. The trimming process described above may now be used in the normal fashion. The gold layer will sputter much faster than the aluminum oxide so that the gold layer will be utilized to accomplish the tuning without measurably disturbing the aluminum oxide layer.

It should be noted that material is removed only from the negatively biased electrode in this process, therefore, individual electrodes of multi-resonator devices such as monolithic filters may be independently tuned by selectively connecting each resonator electrode to the power source. Also it is common practice in monolithic crystal filter design to deposit a metallic electrode in the form of a narrow stripe of metalization between the resonator electrodes and to vary the mass of this stripe as a coupling adjustment. By varying this coupling the filter bandwidth may be adjusted. Providing an electrical connection from this stripe of metal to the outside of the enclosure makes it possible to adjust the resonator coupling in the same manner as described above for adjusting resonator frequency.

Figure 2:
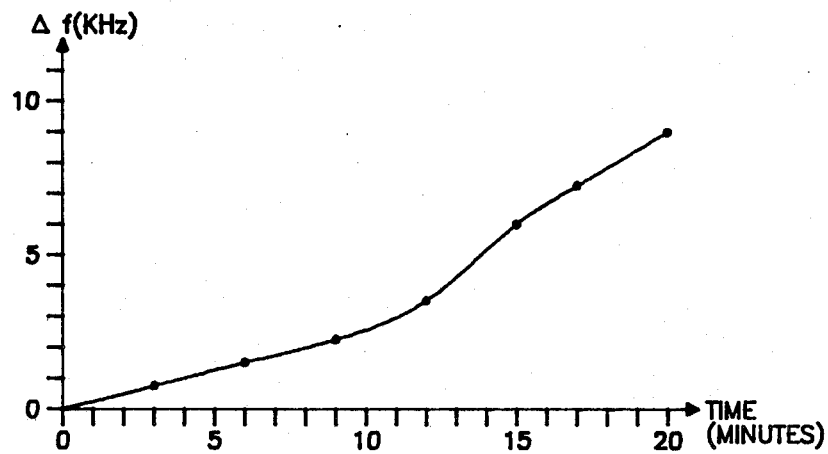
FIG. 2 is a plot of typical frequency change vs. time for the method of the present invention.

FIG. 2 shows a plot of frequency change (f) in kHz vs time in minutes for a typical resonator tuning. The electrode being trimmed is one resonator electrode of a 2-pole 17.9 MHz crystal filter. It is packaged in a standard HC-18 metal can, and the electrode material is silver. It is trimmed with a glow current of 0.2 mA to remove material from the resonator electrode, thereby, increasing the resonant frequency. Frequency changes this large should probably not be made by adding mass to the electrode without using the above described technique using shadow mask 27.

Figure 3:
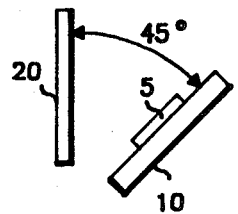
FIG. 3 illustrates the optimum orientation for the substrate and the metallic surface.

It has also been discovered by experimentation outside of a permanently sealed package that a more rapid and uniform sputtering of the electrode metal can be obtained by placing the plane of metal surface 20 at approximately a 45° angle with the substrate as shown in FIG. 3. This is not limiting however, and may be difficult to implement in small hermetically sealed enclosures.

It should be noted that the atmosphere within enclosure 15 should be carefully controlled in order to obtain a quality tuning. Preferably, all oxygen should be removed from the atmosphere before backfilling with the inert gas, since oxygen greatly reduces the sputtering rate of most material and will contaminate the electrode surface. A proper operating pressure should be maintained in order to obtain a suitable glow current. A suitable operating pressure has been found to be from approximately 0.70 to 0.85 torr.

Normally, a current limiting resistor 30 would be placed in series with the DC power source to limit the glow current. A glow current limited to approximately 0.2 mA for aluminum and approximately 0.3 mA for electrodes comprised of either gold or silver has been found to provide rapid, yet controllable sputtering rates under the conditions described.

While specific embodiments of this invention have been described, further modifications and improvements will occur to those skilled in the art. All modifications which retain the basic underlying principle disclosed and claimed herein are within the scope of this invention.

We claim:

1. A method of adjusting the frequency of a piezoelectric resonator device having an aluminum electrode, comprising the steps of:
   oxidizing the surface of said aluminum electrode to form an aluminum oxide layer;
   mass loading said aluminum electrode by applying rapidly sputterable material to said aluminum oxide layer;
   placing said resonator device within an enclosure, said enclosure having an internal metallic surface which is electrically accessible from outside of said enclosure;
   providing an atmospheric environment suitable for supporting an electrical glow discharge within said enclosure;
   sealing said enclosure permanently; and
   applying an electrical potential appropriate for establishing an electrical glow discharge within said enclosure between said aluminum electrode and said internal metallic surface,
   whereby metallic particles are sputtered to reduce the mass loading of said aluminum electrode while inside said permanently sealed enclosure.

2. The method of claim 1 wherein the providing step is comprised of the steps of:
   evacuating gases from said enclosure; and
   backfilling said enclosure with an inert gas to a specified pressure.

3. The method of claim 2 including the step of establishing said pressure to be approximately 0.7 to 0.85 torr.

4. The method of claim 2 wherein the sealing step includes the step of hermetically sealing said enclosure permanently.

5. The method of claim 4 wherein the applying step includes the step of applying a D.C. potential of appropriate voltage for establishing an electrical glow discharge within said enclosure between said aluminum electrode and said internal metallic surface.

6. The method of claim 5 including the step of selecting said enclosure to be a substantially all metal enclosure having an inner surface, whereby said inner surface serves as said internal metallic surface.

7. The method of claim 1 wherein said aluminum electrode and said metallic surface are substantially planar and including the step of orienting the planes of said aluminum surface and said metallic electrode at approximately a 45° angle.

8. The method of claim 1 wherein the step of mass loading includes the step of applying a non electrically continuous layer of a metal which has a high sputtering rate over the surface of said resonator.

* * * * *